United States Patent
Brouns

(10) Patent No.: US 7,138,631 B2
(45) Date of Patent: Nov. 21, 2006

(54) PHOTODETECTOR EMPLOYING SLAB WAVEGUIDE MODES

(75) Inventor: Austin J. Brouns, Dallas, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 179 days.

(21) Appl. No.: 10/881,238

(22) Filed: Jun. 30, 2004

(65) Prior Publication Data

US 2006/0000976 A1    Jan. 5, 2006

(51) Int. Cl.
*G01J 5/00* (2006.01)
(52) U.S. Cl. .................................. 250/353
(58) Field of Classification Search .............. 250/353
See application file for complete search history.

(56) References Cited

U.S. PATENT DOCUMENTS

| | | | | |
|---|---|---|---|---|
| 5,229,614 A | * | 7/1993 | Andersson et al. | 250/370.12 |
| 5,519,529 A | * | 5/1996 | Ahearn et al. | 359/248 |
| 6,133,571 A | * | 10/2000 | Dodd | 250/338.4 |
| 6,875,975 B1 | * | 4/2005 | Faska et al. | 250/214.1 |
| 2003/0108083 A1 | * | 6/2003 | Seitz | 374/120 |
| 2003/0146374 A1 | * | 8/2003 | Bois et al. | 250/225 |

FOREIGN PATENT DOCUMENTS

FR    2741489 A1 *  5/1997
JP    2000058884 A *  2/2000

* cited by examiner

*Primary Examiner*—Constantine Hannaher
(74) *Attorney, Agent, or Firm*—Daren C. Davis; James E. Walton

(57) ABSTRACT

A photodetector for detecting infrared radiation (IR) using a slab waveguide is described. The slab waveguide photodetector operates by resonating transverse magnetic or electric modes within the slab from the incident IR. An IR absorbing layer is located within the slab waveguide photodetector where the magnitude of the electric field vector is greatest. This permits the use of a thinner IR absorbing layer without sacrificing photoresponse. Multi-color slab waveguide photodetectors are permitted because multiple transverse magnetic or electric modes resonate within the slab waveguide. A reflective or transmissive grating is used to launch the IR into the IR absorbing layer through a cladding or antireflection layer.

58 Claims, 10 Drawing Sheets

PHOTODETECTOR EMPLOYING SLAB WAVEGUIDE MODES

FIELD OF THE INVENTION

The present invention relates to an apparatus for detecting radiation. In particular, the present invention provides for detecting infrared radiation using waveguide modes.

BACKGROUND OF THE INVENTION

Photodetectors for infrared (IR) radiation have many applications. IR radiation can often be used to detect objects where visible light is either blocked or not present. Thus, it is possible to use IR detection at night or through clouds, dust, or haze. An IR photodetector can be in the form of either a single detecting element or an array of such detecting elements to produce an image. A photodetector that produces such an image is termed a focal plane array.

IR radiation can be detected by various methods. One such method is using a material that generates electric charge carriers in response to absorbing incident IR radiation. Examples of such photosensitive material are mercury cadmium telluride (HgCdTe) and a multi-layered structure termed a multiple quantum well (MQW) structure that has alternating layers of wells and barriers. Photodetectors fabricated from MQW material are termed quantum well IR photodetectors (QWIPs).

Depending upon the application, photodetectors may place great importance on sensitivity. Many different photodetector designs have been promulgated in the effort to satisfy this need for high sensitivity. Most of these designs, however, place very stringent requirements upon the materials used in the photodetector and/or the processes by which the photodetectors are fabricated. The result is that these photodetectors are expensive. Thus, there exists a need for a photodetector design that relaxes the material and/or fabrication process requirements, thereby reducing costs.

Still other applications require a photodetector that is sensitive to more than one band of infrared radiation, i.e., multi-color photodetectors. Such applications place even more stringent requirements on the materials and the fabrication process than do single color photodetectors. Further, many of the high sensitivity designs for single color photodetectors cannot be employed in multi-color photodetectors without significantly reducing sensitivity. Thus, there exists a need for a photodetector design that can be applied to both single and multi-color photodetectors without reducing the sensitivity of the photodetector.

BRIEF SUMMARY OF THE INVENTION

A first object of the invention is to provide a high sensitivity IR photodetector that is sensitive to a single band of IR radiation. A photodetector according to a first embodiment that satisfies this first object comprises an IR absorbing layer for absorbing IR radiation. First and second contacts are disposed on opposing surfaces of the IR absorbing layer. A cladding layer having a lower index of refraction is disposed upon the second contact opposite the IR absorbing layer. A grating is disposed on a surface of the cladding layer opposite the IR absorbing layer. The grating launches the IR radiation into the IR absorbing layer. A total thickness of the first and second contacts and the IR absorbing layer is such that the photodetector will support a waveguide mode for the IR radiation to be absorbed by the IR absorbing layer. The resulting photodetector generates a signal between the first and second contacts when the IR absorbing layer absorbs the IR radiation. This first embodiment photodetector is termed a slab waveguide QWIP when the IR absorbing layer is formed of MQW material.

A second object of the invention is to provide a high sensitivity multi-color IR photodetector that is sensitive to multiple bands of IR radiation. A multi-color photodetector according to a second embodiment that satisfies this second object comprises a first IR absorbing layer for absorbing a first band of IR radiation. First and second contacts are disposed on opposing surfaces of the first IR absorbing layer. The multi-color photodetector further comprises a second IR absorbing layer for absorbing a second band of IR radiation. The second IR absorbing layer is disposed between the second contact and a third contact, thereby forming a five layer structure of alternating contacts and IR absorbing layers. A cladding layer having a lower index of refraction is then disposed upon the third contact opposite the second IR absorbing layer. A grating is disposed on a surface of the cladding layer opposite the second IR absorbing layer. The grating launches the first and second bands of IR radiation into the two IR absorbing layers. A total thickness of the five layer structure of alternating contacts and IR absorbing layers is such that the photodetector will support waveguide modes for both the first and second bands of IR radiation to be absorbed by the corresponding first and second IR absorbing layers. The resulting multi-color photodetector generates a first signal between the first and second contacts when the first IR absorbing layer absorbs IR radiation in the first band of IR radiation. The multi-color photodetector generates a second signal between the second and third contacts when the second IR absorbing layer absorbs IR radiation in the second band of IR radiation. This second embodiment photodetector is termed a multi-color slab waveguide QWIP when the first and second IR absorbing layers are formed of MQW materials.

A third object of the invention is to provide an IR photodetector at a low cost. A photodetector that satisfies this third object is either of the above embodiments fabricated from III–V MQW material. III–V MQW material, such as that formed of AlGaAs/GaAs, is significantly less expensive than many other materials sensitive to IR radiation. Further, the cost of the III–V MQW material is relatively independent of the wavelength of the IR radiation to be absorbed. The cost of HgCdTe material increases significantly as the absorption IR wavelength increases. III–V MQW material is also available in substrate sizes significantly larger than HgCdTe further reducing costs. The cost of fabricating photodetectors from III–V MQW material is significantly less than other materials as well. A number of commercial devices are fabricated from III–V materials resulting in stable fabrication processes with very narrow tolerances, resulting in higher yields and lower costs.

A fourth object of the invention is to provide a multi-color IR photodetector design that does not compromise sensitivity relative to a single color IR photodetector. A photodetector that satisfies this fourth objective is the second of the above embodiments. As the position of the electric field maxima produced in the photodetector are due to creation of waveguide modes, the IR absorbing layers can be precisely located to minimize sensitivity loss. Sensitivity loss is further reduced by minimizing ohmic losses in the grating by placing the grating outside the high field region of the multi-color IR photodetector. That is, by locating the grating in the cladding layer where the electric field is low, ohmic losses are reduced, resulting in greater field strength for absorption by the two or more IR absorbing layers.

While the above objects and embodiments are for single devices, one and two-dimensional arrays of such devices for creating images, i.e., focal plane arrays, are also envisioned. Methods corresponding to each of the above embodiments are also envisioned.

BRIEF DESCRIPTION OF THE DRAWINGS

The present invention is described in reference to the following Detailed Description and the drawings in which:

FIGS. 2A, 2B, 2D, and 2E illustrate cross sectional views of photodetectors according to a first embodiment, while

DETAILED DESCRIPTION OF THE INVENTION

Figure 1A:
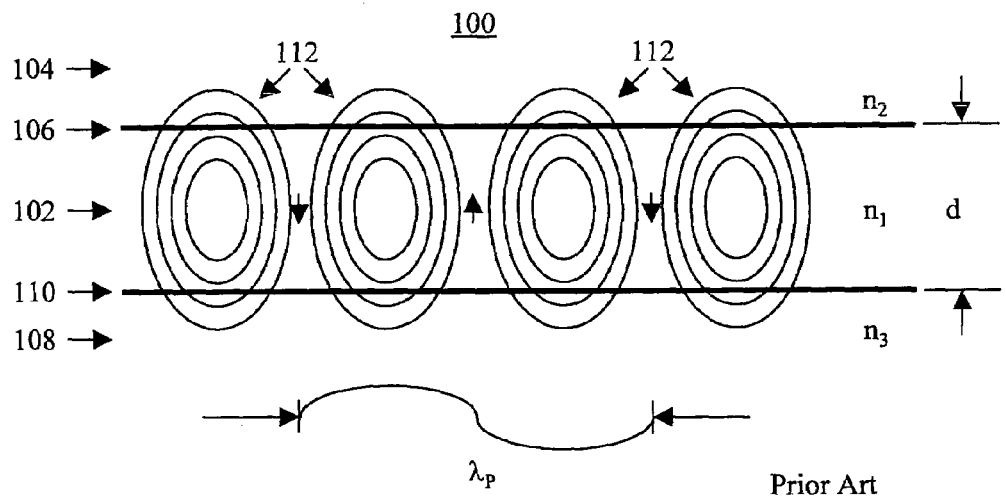
FIGS. 1A–1C illustrate three waveguide modes in a prior art slab waveguide structure.

FIG. 1A illustrates an ideal dielectric slab waveguide structure 100 capable of supporting a number of different waveguide modes. The ideal slab waveguide structure 100 includes a center slab 102 having a first index of refraction $n_1$ and a thickness of d. Above the center slab 102 is a first dielectric half space 104 with an interface 106 formed between the center slab 102 and the first dielectric half space 104. The first dielectric half space 104 has a second index of refraction $n_2$. Below the center slab 102 is a second dielectric half space 108 with an interface 110 formed between the center slab 102 and the second dielectric half space 108. The second dielectric half space 108 has a third index of refraction $n_3$. For the perfectly symmetric case illustrated, the first and second dielectric half spaces 104, 108 must have equal indices of refraction, i.e., $n_2=n_3$. In an asymmetric case, $n_2$ and $n_3$ are not equal; for example $n_2=1$ (air or vacuum) and $n_3>1$. Further, for electromagnetic (EM) waves to propagate down the length of the center slab 102, the index of refraction for the center slab 102 must be greater than the indices of refraction for the first and second dielectric half spaces 104, 108. In other words, $n_1>n_2, n_3$.

When an EM wave is "launched" into the center slab 102, such as from an end of the center slab 102, the EM wave undergoes total internal reflection (TIR) at the interfaces 106 and 110. Propagation of the EM wave in this manner creates a large number of wavefronts that destructively interfere with themselves, thereby rapidly attenuating the EM wave. However, wavefronts that undergo TIR at certain favorable incidence angles will constructively interfere with themselves, allowing propagation of the EM wave without attenuation, i.e., lossless propagation. These conditions are a function of the wavelength of the EM wave, the indices of refraction $n_1$, $n_2$, $n_3$ of the center slab 102, and the first and second dielectric half spaces 104, 108, and the thickness of the center slab 102. Associated with these lossless propagating EM waves are specific EM field patterns termed "waveguide modes." This concept of losslessly propagating an EM wave using TIR works for EM radiation having virtually any wavelength under the correct conditions. The present invention applies this lossless propagating EM wave concept to IR radiation, generally having free space wavelengths in the range of 3–20 μm.

FIG. 1A illustrates the electric field patterns 112 at a specific instant in time for an EM wave that is propagating without attenuation. Due to the single maximum in the center slab 102 in the thickness direction, the illustrated waveguide mode is termed the $1^{st}$ even transverse magnetic (TM) mode. In real time, the electric field patterns would propagate to the right (or left) with a propagation velocity and a propagation wavelength $\lambda_P$ characteristic of the $1^{st}$ even TM mode. Adjacent groups of electric field patterns have opposite polarities as indicated by the arrows showing the direction of the local electric field vector. A plot of the electric field strength and polarity along a center plane of the center slab 102 would be a sine wave having a characteristic propagation wavelength of $\lambda_P$. If a second, identical counter-traveling EM wave of the same magnitude and propagation wavelength is launched into the center slab 102, a standing wave would result. The standing wave would not propagate to either the left or right, but would oscillate between positive and negative maxima.

Figure 1B:
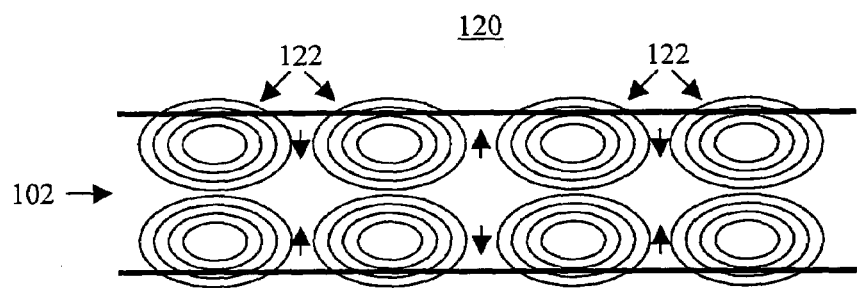
Figure 1C:
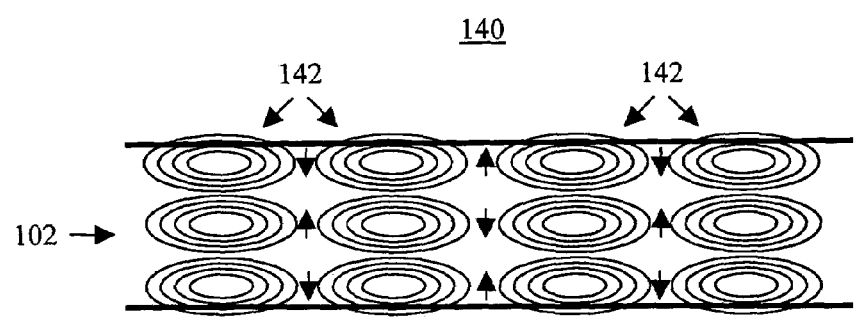

For EM radiation having a given free space wavelength, multiple TM waveguide modes may be supported by the ideal dielectric slab waveguide structure 100 depending upon the thickness d of the center slab 102 and the refractive indices $n_1$, $n_2$, $n_3$. FIGS. 1B and 1C illustrate the electric field patterns 122, 142 of the $1^{st}$ odd and $2^{nd}$ even TM modes 120, 140. All of the TM waveguide modes propagate simultaneously and independently within the center slab 102, generally with different propagation wavelengths. Note that for a given free space wavelength, a sufficiently thin ideal dielectric waveguide structure 100 exists that will support only the $1^{st}$ even TM mode, while all higher order modes are cut off. As the thickness of the ideal dielectric waveguide structure 100 increases, it will support the $1^{st}$ odd TM mode illustrated in FIG. 1B. Further increases in thickness will support the $2^{nd}$ even TM mode illustrated in FIG. 1C. Still further increases in the thickness of the ideal dielectric waveguide structure 100 will support even higher order TM modes. Each successive TM mode for the given free space wavelength will have progressively longer propagation wavelengths. For EM radiation having two distinct free space wavelengths, multiple TM waveguide modes are supported by the ideal dielectric slab waveguide structure 100. It is generally possible to find a slab thickness d and/or refractive indices $n_1$, $n_2$, $n_3$, such that the propagation wavelength is the same for a first TM mode due to the first free space wavelength and a second TM mode due to the second free space wavelength. This principle of equal propagation wavelengths can be extended to more than two free space wavelengths, but the thickness of the ideal dielectric waveguide structure 100 may significantly increase. Lastly, while FIGS. 1A–1C illustrate TM modes propagating to either the left or the right, the ideal dielectric slab waveguide structure 100 will support another set of TM modes propagating orthogonally to those illustrated, i.e., normal to the plane of the drawings.

One particular fact that is relevant to the present invention is the direction of the electric field vector in the TM mode. As can be seen, especially in FIG. 1A, a large component of the electric field vector is normal to the center plane of the center slab 102, especially near the center plane itself. Why it is important to have a large component of the electric field vector normal to the center plane of the center slab 102 is described below in conjunction with the MQW material description. Further, because the electric field vectors are normal to the center plane of the center slab 102, a planar conducting layer or groundplane can be placed at the center plane without significantly altering the even TM mode pattern. Similarly, in FIG. 1C illustrating the 2nd even TM mode, a groundplane can be placed at the center plane of the center slab 102 without altering the TM mode pattern. This is not the case in FIG. 1B illustrating the 1st odd TM mode where the electric field lines are parallel to the center plane of the center slab 102. Thus a slab waveguide utilizing a conducting metal groundplane on one surface can support even TM modes, but cannot support odd TM modes.

Figure 2A:
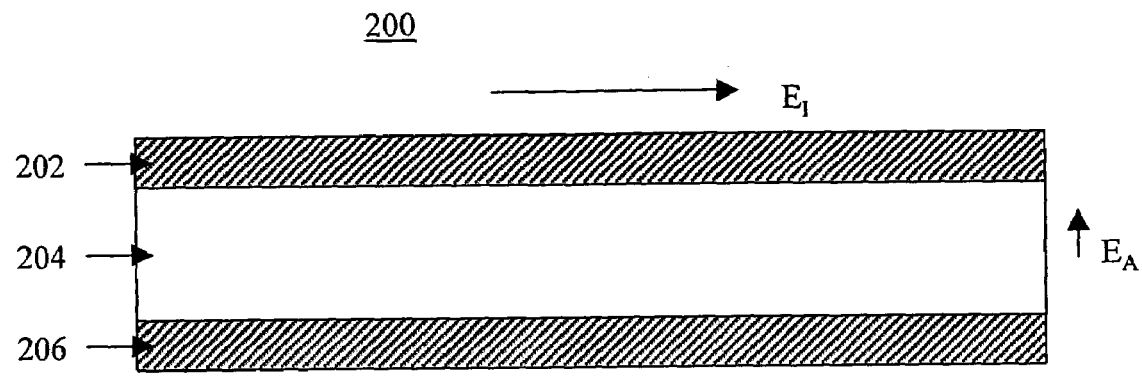

The present invention employs the TM modes described above to enhance the performance of IR photodetectors. The slab 200 for a slab waveguide photodetector according to a first embodiment of the present invention is illustrated in FIG. 2A. The slab 200 includes an IR absorbing layer 204 and first and second contacts 202, 206 on either side of the IR absorbing layer 204. FIG. 2A includes a vector labeled $E_I$ that indicates the direction of the electric field of the incident IR radiation that is to be absorbed. A second vector, labeled $E_A$, indicates the direction of the electric field required for strong absorption by the IR absorbing layer 204 if the IR absorbing layer 204 is formed of MQW material.

The IR absorbing layer 204 is preferably formed of any one of several MQW materials. Selection of the particular MQW material and design is determined by what wavelength of IR radiation is to be absorbed. A slab waveguide QWIP may operate in any of the three following wavelength ranges. The middle wavelength IR (MWIR) corresponds to wavelengths of 3–5 µm, the long wavelength IR (LWIR) corresponds to wavelengths of 8–12 µm, and the very long wavelength IR (VLWIR) corresponds to wavelengths of 12–20 µm. For each of the different MQW material designs the barriers and wells will likely have different compositions and thicknesses. For operating in the LWIR or VLWIR, AlGaAs barriers and GaAs wells are typically used, while operating in the MWIR typically uses AlGaAs barriers and InGaAs wells. Other MQW material designs can employ InGaAsP or InP barriers and InAs or InGaAs wells. A typical barrier thickness is 300–500 Å, while a typical well thickness is 25–50 Å, the specific values depending upon the desired IR absorption wavelength band. The first and second contacts 202, 206 are preferably doped semiconductor material, such as n-type GaAs having a thickness in the range of 0.2–1.0 µm. The primary purpose of the first and second contacts 202 and 206 is to provide a low resistance electrical contact to the IR absorbing layer 204. The index of refraction for the first and second contacts 202 and 206 is approximately the same as the index of refraction for the IR absorbing layer 204. The slab 200 is typically deposited by molecular beam epitaxy, which permits growing the first contact 202, the IR absorbing layer 204, and the second contact 206 sequentially in a single run.

Figure 1D:
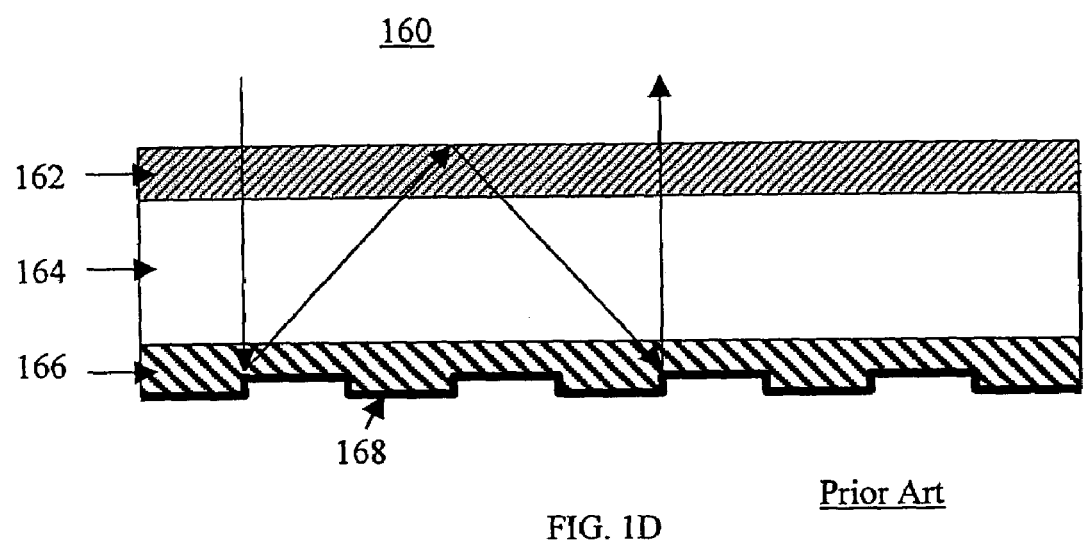
FIG. 1D illustrates a prior art QWIP photodetector.

MQW material differs from other material used to make IR photodetectors due to quantum mechanical selection rules. MQW material absorbs only a very small portion of the incident IR radiation if the electric field of the IR radiation $E_I$ is parallel to the plane of the multiple quantum wells. For MQW material to strongly absorb the IR radiation, the IR radiation must have a significant component of its electric field vector $E_A$ normal to the plane of the multiple quantum wells. Those of skill in the art will appreciate that optical gratings are typically used in QWIPs for diffracting the incident IR radiation so that it can be absorbed in the MQW material. Such optical gratings provide an efficient means for changing the direction of the electric field vector of the incident IR radiation. However, these optical gratings scatter the IR radiation in a manner such that after only a few passes through the MQW material, a significant fraction of the IR radiation is either transmitted back out the incident surface of the QWIP or absorbed through ohmic losses in the optical grating. FIG. 1D illustrates the case where incident IR radiation is diffracted by a grating 168, passes through the IR absorbing layer 164 twice, and then is diffracted back out of the QWIP 160. The ohmic losses are due to the optical grating being located within the high electric field region of a waveguide structure.

The actual IR absorption process itself will now be described. The wells of the MQW material are doped n-type such that electrons populate the wells in the ground, or unexcited state. Upon absorbing an IR photon, an electron is excited into a first excited state, preferably at an energy approximately equal to the barrier energy. This excited electron is then free to move about within the MQW material. However, by placing an external bias across the MQW material with electrical contacts, the excited electron can be collected at one of the contacts resulting in an increase in current, or a decrease in resistance. With respect to FIG. 2A, an IR photon is absorbed within IR absorbing layer 204, which is formed of MQW material, and excites an electron. By placing an external bias across the first and second contacts 202, 206, the excited electron is collected and a change in current or resistance is sensed. This change in current or resistance is known as the photoresponse of the detector.

Figure 2B:
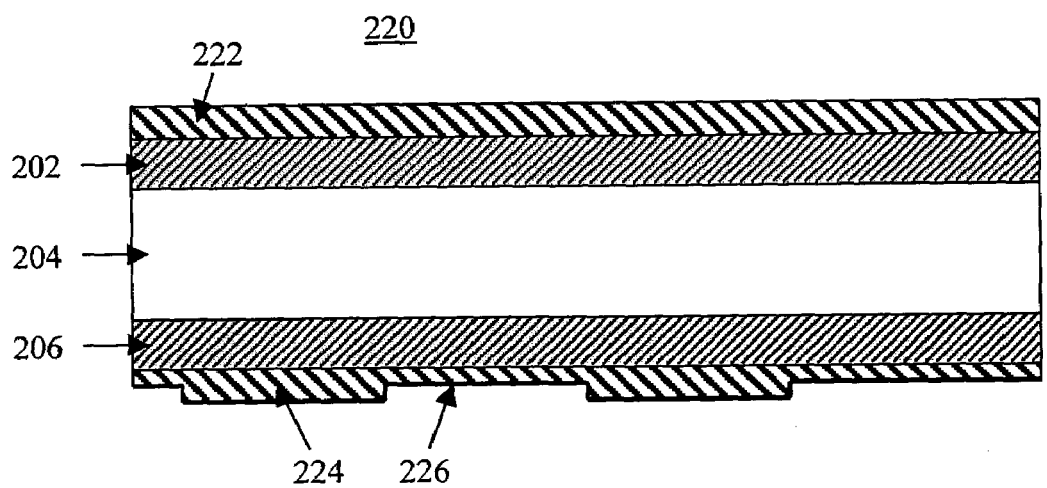

Because the slab 200 shown in FIG. 2A is completely planar, little if any incident IR radiation would be absorbed in the IR absorbing layer 204 if made of MQW material. By being planar, the slab 200 has no structure capable of changing the direction of the electric field vector of the incident IR radiation. To form a sensitive slab waveguide QWIP 220, additional processing is required. FIG. 2B illustrates the result of the additional processing required to form a first embodiment of a sensitive slab waveguide QWIP 220. The slab waveguide QWIP 220 shown in FIG. 2B includes an optional antireflection layer 222 disposed on the surface of the first contact 202 opposite the IR absorbing layer 204. A cladding layer 224 is disposed on the second contact 206 opposite the IR absorbing layer 204. The surface of the cladding layer 224 opposite the second contact includes a grating. A reflective layer 226 is disposed on the grating surface of the cladding layer 224, thereby forming a reflective grating. Referring back to FIG. 1A, the slab 200, with IR absorbing layer 204 and first and second contacts 202, 206, corresponds to the center slab 102. The optional antireflection layer 222 corresponds to the first dielectric half space 104. While the optional antireflection layer 222 has a finite thickness, this has little impact on creating a waveguide so long as the thickness of the optional antireflection layer 222 is greater than the penetration depth of the evanescent fields created upon TIR of the IR radiation. The cladding layer 224 corresponds to the second dielectric half space 108. Likewise, the thickness of the cladding layer 224 is preferably greater than the penetration depth of the evanescent fields. If the optional antireflection layer 222 is not present, then the air (or vacuum) above the slab 200 corresponds to the first dielectric half space. In this case, the resultant slab waveguide QWIP will be asymmetric as $n_{air} < n_{cladding}$.

For the antireflection layer 222 to reduce reflection of incident IR radiation, the index of refraction of the antireflection layer 222 is less than the index of refraction of the first contact 202. The thickness of the antireflection layer 222 is a function of the wavelength of the IR radiation to be absorbed, and the indices of refraction of the antireflection layer 222 and the first contact 202. While the antireflection layer 222 is illustrated as a single layer, it may include a plurality of laminae. The design of antireflection layers is well known within the art and will not be described further. While the antireflection layer 222 is designed to reduce reflection of the incident IR radiation, it also serves as a second cladding layer for the slab waveguide QWIP 220. The antireflection coating 222 is preferably formed of a material common to III–V material processing to reduce fabrication costs, such as $SiO_2$ and $Si_3N_4$. Because the indices of refraction for $SiO_2$ and $Si_3N_4$ are between that of free space and the first contact layer 202, $SiO_2$ and $Si_3N_4$ work well for reducing reflection of the incident IR radiation. The antireflection coating is also preferably a low loss dielectric as high loss dielectrics will reduce overall slab waveguide QWIP 220 sensitivity. For this reason, while both $SiO_2$ and $Si_3N_4$ work well in the MWIR, they become too lossy for efficient use in the LWIR.

The second contact 206 and cladding layer 224 structure incorporating a reflective grating is the preferred method of launching IR radiation into the IR absorbing layer 204. The second contact 206 and cladding layer 224 structure is formed using an additive process. The additive process includes depositing a dielectric material, such as $SiO_2$ or $Si_3N_4$ on the second contact 206 to form the cladding layer 224. A portion of the dielectric material is protected with photoresist and the unprotected dielectric material is etched. Removal of the photoresist reveals a series of pits etched into the dielectric material resulting in the desired grating. Because the grating has two levels, such a grating is also called a relief grating. Studies have shown that the most efficient gratings have approximately 50% of the surface area etched while the remaining 50% of the surface area retains its original surface, i.e., an etched to unetched ration of 1:1. However, etched to unetched ratios ranging from at least 1:4 to 4:1 will launch the IR radiation. The depth and period of the grating depends upon the free space wavelength of the IR radiation to be absorbed, among other factors. The depth of the grating in the present invention is preferable approximately one-fourth of a bulk wavelength $\lambda_B$ to maximize grating efficiency. However, even grating depths significantly different from one-fourth of the bulk wavelength $\lambda_B$ will launch the IR radiation. The bulk wavelength $\lambda_B$ is not the same as the propagation wavelength $\lambda_P$ introduced above. The bulk wavelength $\lambda_B$ equals the free space wavelength of the IR radiation divided by the index of refraction of the layer through which the IR radiation is traveling. The optimized depth of the grating will thus be greater in the slab waveguide QWIP 220 than in the prior art QWIP. This is due to the IR radiation traveling through the cladding layer 224, which has a lower index of refraction than the contact of a prior art QWIP, which is typically doped GaAs. Similarly, the optimized grating period for the present invention is usually different from that of the prior art QWIP. The preferred grating period is the propagation wavelength $\lambda_P$ of the IR radiation within the slab waveguide QWIP 220, while multiples thereof are also permitted. The grating period of a prior art EQWIP, as disclosed in U.S. Pat. No. 5,539,206, is even longer than the bulk wavelength $\lambda_B$ as the resonant wave travels partly in MQW material and partly in air.

To further distinguish the present invention from the prior art QWIP 160 illustrated in FIG. 1D, the location of the grating 168 must be considered. The grating 168 in the prior art QWIP 160 is formed on a surface of the second contact 166, which, together with first contact 162 and IR absorbing layer 164, form a slab. In other words, the grating 168 is located at the surface of a slab and is thus subjected to high electric fields, thereby creating significant ohmic losses in the grating. In contrast, the grating in the slab waveguide QWIP 220 is formed on a surface of the cladding layer 224. The slab waveguide QWIP 220 separates the high field portion of the waveguide from the grating as TIR ensures that little of the electric field penetrates through the cladding layer 224 to the grating.

Figure 2C:
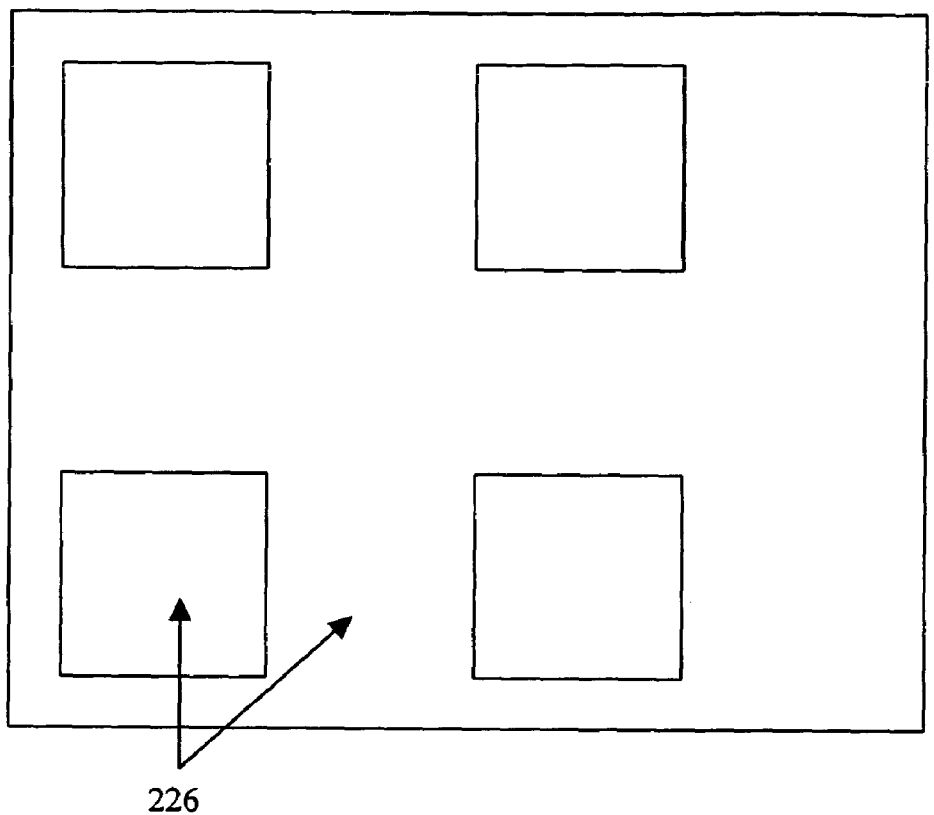
FIG. 2C illustrates a plan view of a photodetector according to the first embodiment.

The reflective layer 226 is deposited on the grating to form the reflective grating and is preferably formed of metals, such as gold or alloys thereof. Gold is the preferred reflective layer 226 material as it minimizes ohmic losses in the reflective layer 226. A thin layer of Ti may be included to promote adhesion of the reflective layer 226 to the cladding layer 224. The reflective layer 226 should provide substantially complete reflection of the incident IR radiation. A reflective layer 226 thickness of at least 2000 Å is generally sufficient. FIG. 2C is a plan view of the reflective layer 226 showing the conformal nature of the reflective layer 226 over the etched pits. As can be seen in FIG. 2C, the reflective layer 226, and thus the grating, preferably form a two-dimensional reflective grating. Two-dimensional reflective gratings are preferred as both polarizations of the incident IR radiation may be launched into the IR absorbing layer 204 and thereby absorbed. However, if sensitivity to only a single polarization is desired, a one-dimensional reflective grating may be used.

Figure 2D:
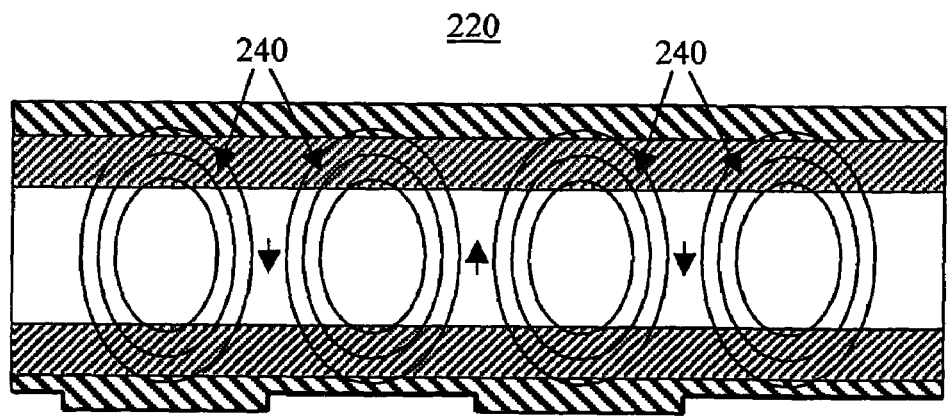

FIG. 2D shows the electric field patterns 240 generated by incident IR radiation within the slab waveguide QWIP 220. The slab waveguide QWIP 220 differs in several respects from the ideal dielectric slab waveguide 100 shown in FIG. 1A. The TM modes in the ideal dielectric slab waveguide 100 are due to launching EM radiation from an end of the ideal dielectric slab waveguide 100. In contrast, the TM modes in the slab waveguide QWIP 220 are due to launching IR radiation from the reflective layer 226 disposed on the grating surface of the cladding layer 224, i.e., the reflective grating. The reflective grating will launch many wavefronts into the first and second contacts 202, 206 and IR absorbing layer 204. A majority of these wavefronts will be nonpropagating waves confined to the second contact 206, contributing little to the photoresponse of the slab waveguide QWIP 220. A few of the wavefronts will result in propagating waves in the first and second contacts 202, 206 and IR absorbing layer 204, thereby forming the various TM modes, the $1^{st}$ even TM mode being illustrated in FIG. 2D. These propagating waves are confined to the first and second contacts 202, 206 and IR absorbing layer 204 through TIR at both the antireflection layer 222 and the cladding layer 224. The various TM modes, with their high electric fields concentrated in the IR absorbing layer 204, contribute the bulk of the photoresponse of the slab waveguide QWIP 220.

The cladding layer 224 of the slab waveguide QWIP 220 serves to separate the high electric field regions in the IR absorbing layer 204 from the reflective layer 226. However, if the cladding layer 224 is too thick, the IR radiation is trapped near the reflective layer 226 rather than in the IR absorbing layer 204 leading to high ohmic losses. Conversely, if the cladding layer 224 is too thin, the various TM modes are distorted resulting in high fields near the reflective layer 226, again resulting in higher ohmic losses. In practice, a cladding layer 224 thickness of 0.12–0.25 μm is preferred. A thicker or thinner cladding layer 224 is feasible, albeit with reduced performance.

The second effect of the reflective grating is that its presence must be considered in the design of the slab waveguide QWIP 220. In the description of the ideal dielectric slab waveguide 100 above, a number of parameters were important in designing an ideal dielectric slab waveguide 100 to propagate EM radiation. The parameters include the thickness d of the center slab 102, the indices of refraction $n_1$, $n_2$, $n_3$ of the center slab 102, and the first and second dielectric half spaces 104, 108, and the wavelength of the EM radiation. When designing a slab waveguide QWIP 220, the desired wavelength of the EM radiation will be known. Similarly, by specifying the materials for the IR absorbing layer 204, first and second contacts 202, 206, the antireflection layer 202, and the cladding layer 224, the indices of refraction for the slab waveguide QWIP 220 will be known. This leaves the overall thickness of the IR absorbing layer 204, first and second contacts 202, 206 as one of two primary variables. The second primary variable is the period of the reflective grating.

A number of EM simulation programs are available that permit accurate modeling and design of structures, including that of the slab waveguide QWIP 220. By defining each element in a structure by both its physical location and its radiation properties, a free space wavelength scan of the structure will indicate the resonating free space wavelength. By altering the thickness of the IR absorbing layer 204, and the first and second contacts 202, 206, the desired resonating wavelength can be achieved. Once the desired resonating free space wavelength is achieved, the period of the reflective grating is set equal to the propagation wavelength $\lambda_P$ within the slab waveguide QWIP 220, or a multiple thereof. By including the cladding layer 224, the perturbation of the TM modes due to the reflective grating is reduced and the modeling programs more accurately predict resonances in the slab waveguide QWIP 220.

By separating the reflective layer 226 from the IR absorbing layer 204 with the cladding layer 224, the parasitic ohmic losses in the reflective layer 226 are reduced as noted above. Because parasitic ohmic losses are reduced, a greater fraction of the incident IR radiation is converted into useful photocurrent, thereby increasing quantum efficiency (QE). By increasing the quantum efficiency for a given amount of incident IR radiation, the photoresponse of the device increases. Furthermore, the wavelength selectivity or "Q" of the slab waveguide QWIP 220 is increased. As greater field intensities are created in a high Q design, a thinner IR absorbing layer 204 may be used in a slab waveguide QWIP 220 than in prior art QWIPs. The photoconductive gain of the device is inversely proportional to the thickness of the IR absorbing layer 204. Thus, a thinner IR absorbing layer will increase the photoconductive gain of the device resulting in increased responsivity. Noise current, whether in the prior art QWIP or the slab waveguide QWIP 220, is determined by the optimum bias applied across the first and second contacts 202 and 206. As the noise current is proportional to the square root of the photoconductive gain, the detectivity (D*) of the slab waveguide QWIP 220 increases, though not as much as the responsivity. The net effect is that the slab waveguide QWIP 220 will have increased detectivity relative to the prior art QWIP, assuming the quantum efficiency remains high. For applications in which detection of a very narrow band of IR radiation is desired, e.g., an IR laser, the wavelength selectivity of a high Q design results in a slab waveguide QWIP 220 that does not respond to background IR radiation.

Figure 2E:
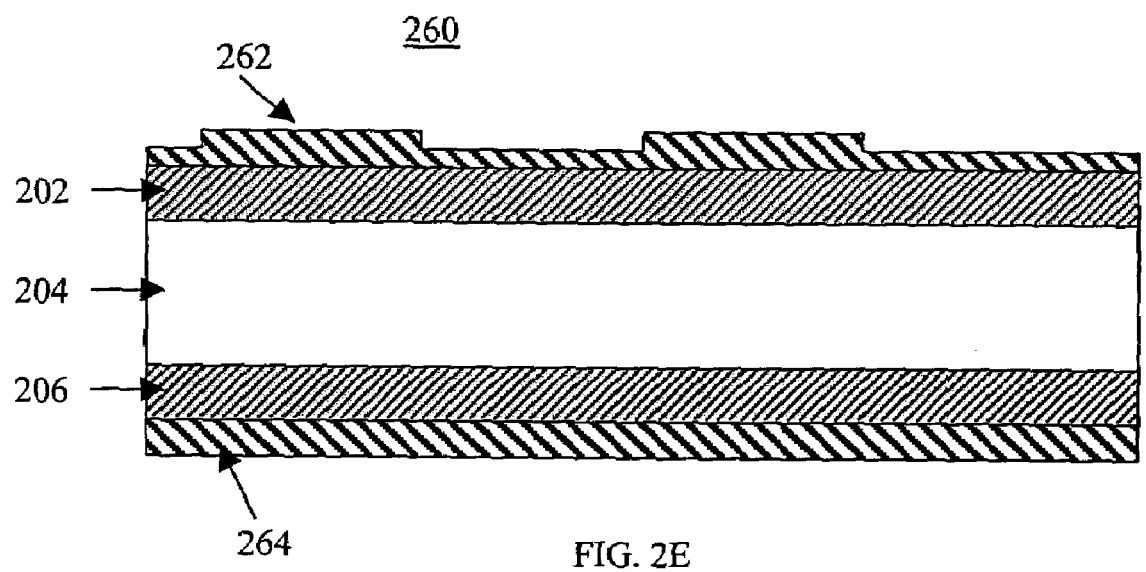

The first example slab waveguide QWIP 220, illustrated in FIGS. 2A–2D, uses a reflective grating. The same operating principles can be used with a transmissive grating as illustrated in FIG. 2E. The slab waveguide QWIP 260 includes the same IR absorbing layer 204 and first and second contacts 202, 206 as slab waveguide QWIP 220. However, a transmissive grating 262 is disposed on the side of the slab waveguide QWIP 260 from which the IR radiation is incident. This transmissive grating 262 functions in part as the first dielectric half space 104 of FIG. 1A, as the transmissive grating 262 is also a cladding layer for TIR of the IR radiation. A second cladding layer 264 is disposed on the side of the slab waveguide QWIP 260 opposite the transmissive grating 262. Both the transmissive grating 262 and the cladding layer 264 are preferably formed of a dielectric material such as $SiO_2$ or $Si_3N_4$.

In operation, the transmissive grating slab waveguide QWIP 260 is similar to the original, reflective grating slab waveguide QWIP 220. The incident IR radiation is launched via many wavefronts into the IR absorbing layer 204 by the transmissive grating 262. Most of these wavefronts are nonpropagating and quickly die out. However, the remaining propagating wavefronts will form the same type of TM modes as those formed in the reflective grating slab waveguide QWIP 220. The IR absorbing layer 204 absorbs the propagating waves, generating a signal between the first and second contacts 202, 206.

Figure 3A:
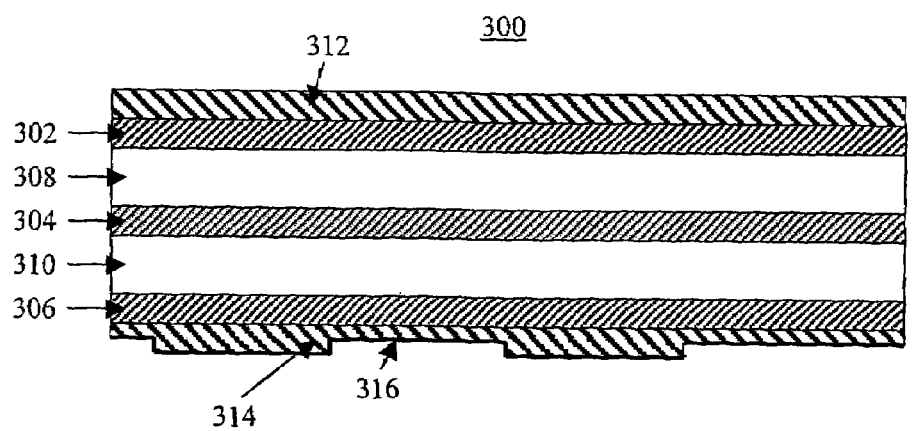
FIGS. 3A–3D illustrate cross sectional views of a photodetector according to a second embodiment.
Figure 3B:
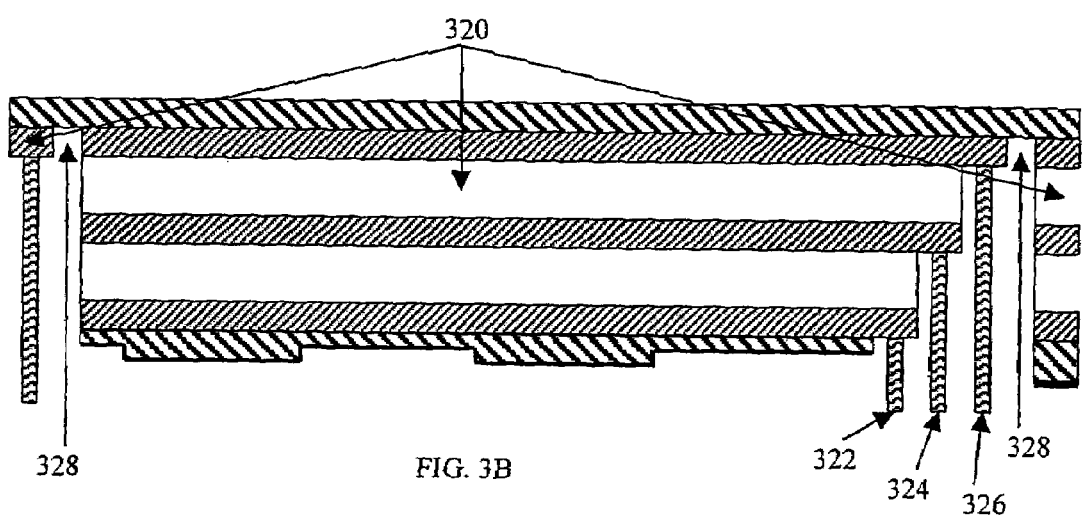
Figure 3C:
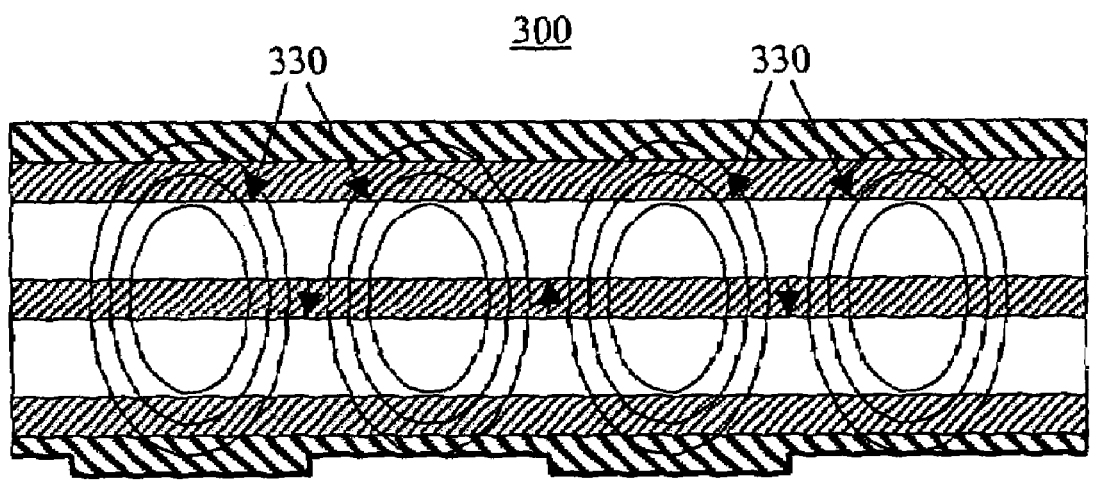
Figure 3D:
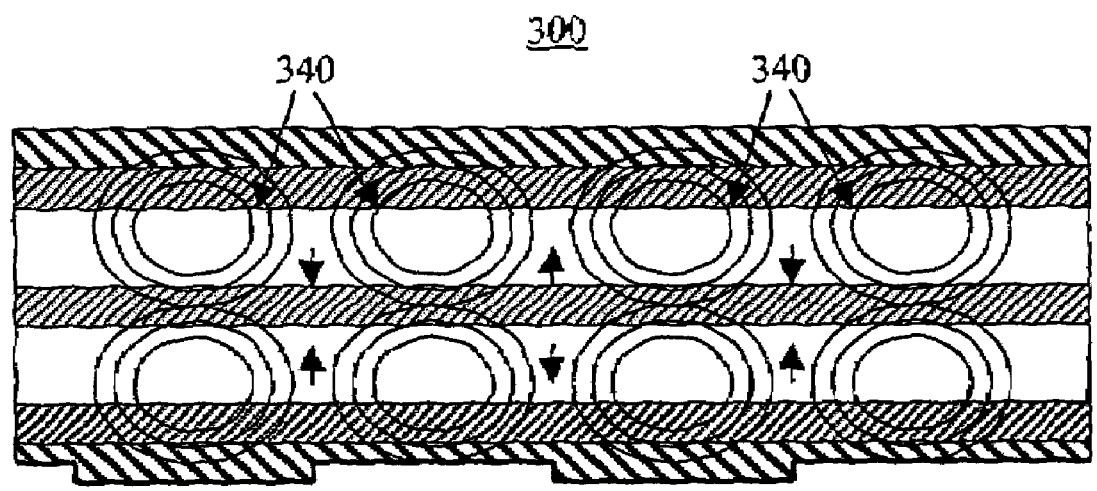

A second embodiment of the present invention is based on the fact that the ideal dielectric slab waveguide structure 100 can support TM modes for radiation at different free space wavelengths. A multi-color slab waveguide QWIP 300 based upon different free space wavelengths is shown in FIG. 3A. The multi-color slab waveguide QWIP 300 includes first, second, and third contact layers 302, 304, 306 to allow detection of two different bands of IR radiation separately. A first band of IR radiation is absorbed in a first IR absorbing layer 308, while a second band of IR radiation is absorbed in a second IR absorbing layer 310. A preferred, though optional, antireflection coating 312 may be placed on the top surface of the multi-color slab waveguide QWIP 300. A cladding layer 314 is placed on the third contact 306. As with the slab waveguide QWIP 220, a reflective grating is formed on a surface of the cladding layer 314 to launch the IR radiation into the first and second IR absorbing layers 308, 310. The final element of the multi-color slab waveguide QWIP 300 is a reflective layer 316. A multi-color slab waveguide QWIP device 320 is illustrated in FIG. 3B. The multi-color slab waveguide QWIP device 320 includes electrical leads 322, 324, 326 to the first, second, and third contact layers 302, 304, 306, respectively. A readout device (not illustrated) applies biases across the electrical leads 322, 324, 326. The readout then senses the resultant current, which is proportional to the amount of IR radiation absorbed in the first and second IR absorbing layers 308, 310. A pixel isolation trench 328 surrounds each multi-color slab waveguide QWIP device 320 to minimize or eliminate crosstalk between adjacent multi-color slab waveguide QWIP devices 320. FIGS. 3C and 3D illustrate the $1^{st}$ even and odd TM modes 330, 340, respectively, supported by the multi-color slab waveguide QWIP 300.

A specific multi-color slab waveguide example operating in the MWIR at free space wavelengths of 4.0 μm and 4.6 μm will now be described in detail. This example produced the absorptance and quantum efficiency results shown in FIG. 4. As noted above, once the materials from which the first, second, and third contacts 302, 304, 306, as well as the first and second IR absorbing layers 308, 310 are selected, the indices of refraction are known. In this example, AlGaAs/InGaAs MQW materials are used for the first and second IR absorbing layers 308, 310, and n-type GaAs for the first, second, and third contacts 302, 304, 306. While the index of refraction for the AlGaAs/InGaAs MQW material is slightly less than for n-type GaAs, the index of refraction in each is approximately 3.2. The antireflection layer 312 and the cladding layer 314 are both formed of $Si_3N_4$ with an index of refraction of 2.0. While the index of refraction is a function of wavelength, this effect is generally small when the wavelengths are close together and is ignored in this example.

First, initial thicknesses for the first and second IR absorbing layers 308, 310, and first, second, and third contacts 302, 304, 306, are selected. The propagation wavelengths for the even and odd TM modes are then determined for both the 4.0 μm and 4.6 μm free space wavelengths within the multi-color slab waveguide QWIP 300. The thicknesses of the first and second IR absorbing layers 308, 310, and first, second, and third contacts, 302, 304, 306, are varied until a match between the propagation wavelengths is found. As noted above, this iterative process may be performed by using an EM simulation program. A thickness for the first and second IR absorbing layers 308, 310, and first, second, and third contacts 302, 304, 306, totaling 1.9 μm produced the following results: For IR radiation having the free space wavelength of 4.0 μm, the first even mode $\lambda_P$ is 1.29 μm, the first odd mode $\lambda_P$ is 1.50 μm, and the second even mode $\lambda_P$ is 1.96 μm. For IR radiation having the free space wavelength of 4.6 μm, only one TM mode, the first even mode is supported and has a propagation wavelength $\lambda_P$ of 1.50 μm. Thus, a total thickness of the first and second IR absorbing layers 308, 310, and first, second, and third contacts 302, 304, 306, of 1.9 μm provides a near perfect match in propagation wavelengths between the first odd mode of the 4.0 μm free space radiation and the first even mode of the 4.6 μm free space radiation.

The greatest difference between the multi-color slab QWIP 300 and the prior art QWIP 160 is the location of the grating. By placing the grating outside the first and second IR absorbing layers 308, 310, and the first, second, and third contacts 302, 304, 306, ohmic losses are minimized. This is because the grating is located in the low field regions of the cladding 314, rather than in the high field regions of the contact 166 in the prior art QWIP 160. In the prior art QWIP 160, the grating 168 is lossy, severely disrupts the normal slab field patterns, and precludes the creation of specific, predictable, waveguide modes that are necessary for efficient, highly selective, multi-color detection. In either a single- or multi-color slab waveguide QWIP, putting the grating in the cladding layer allows the waveguide to function as predicted by classic slab waveguide theory. This makes it possible to precisely select a slab thickness and grating period that are resonant at a desired IR wavelength or simultaneously resonant at two or more wavelengths.

Figure 4:
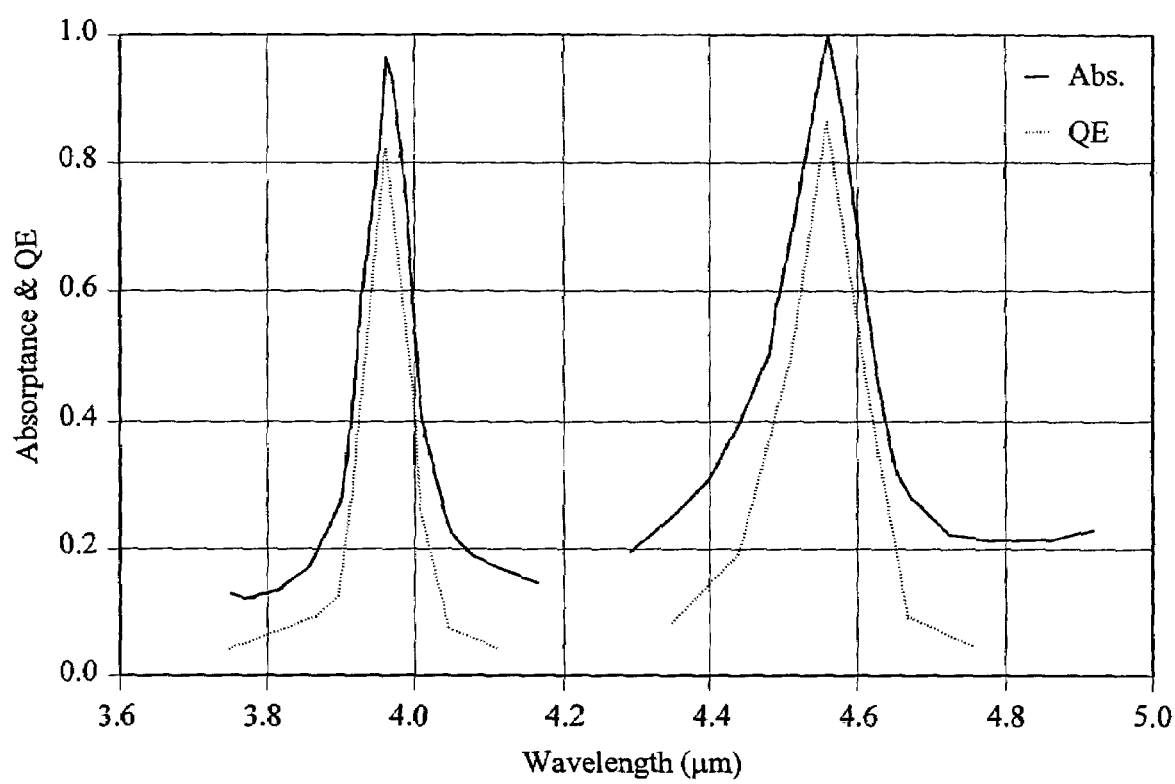
FIG. 4 illustrates the modeled spectral response of a photodetector according to the second embodiment.

The photoresponse of the multi-color slab waveguide QWIP 300 in the above example was modeled using an EM simulation program. The results, shown in FIG. 4, illustrate the benefits of the multi-color slab waveguide QWIP 300 design. Each of the two absorption bands are very narrow, well defined, and do not overlap, leading to excellent spectral separation of the 4.0 μm and 4.6 μm signals. The absorptance curves show nearly 100% of the incident radiation at 4.0 μm and 4.6 μm is absorbed in the first and second IR absorbing layers 308, 310 or in the reflective layer 316. The 100% absorptance indicates that virtually no IR radiation at these wavelengths is reflected. The quantum efficiency curves correspond to only that IR radiation absorbed in the first and second IR absorbing layers 308, 310. The quantum efficiency is greater than 80% at both 4.0 μm and 4.6 μm, indicating the high sensitivity of the multi-color slab waveguide QWIP 300. The parasitic ohmic losses in the reflective layer 316 are less than 15%, which is very low for a photodetector using MQW material in the MWIR.

While the above specific example included two bands of IR radiation within the MWIR, this is not required. A multi-color slab waveguide QWIP can be designed with one wavelength band in the MWIR, while the second wavelength band is in the LWIR. The resultant multi-color waveguide QWIP typically uses a single grating period in which the propagation wavelength $\lambda_P$ for the LWIR band is twice the propagation wavelength $\lambda_P$ for the MWIR band. The single grating period in such a multi-color slab waveguide QWIP will have a period equal to the propagation wavelength $\lambda_P$ for the LWIR band. MWIR/LWIR multi-color slab waveguide QWIPs typically include some compromises as the grating depth cannot be optimized for both wavelength bands. In addition, optimizing the antireflection and cladding layers for both wavelength bands typically includes some compromises. Similarly, a three-color slab waveguide QWIP can be designed. For example, the above specific example could be expanded to include a LWIR wavelength band that produces a propagation wavelength $\lambda_P$ of 3.00 μm. This combination of two MWIR bands and one LWIR band could operate efficiently with a grating period of 3.00 μm, exactly twice the propagation wavelength $\lambda_P$ of 1.50 μm for the two MWIR bands. Such a three-color slab waveguide QWIP would preferably include a total of three IR absorbing layers and four contacts.

A number of other variations to the multi-color slab waveguide QWIP 300 are also contemplated. Some applications may employ two modes, a detection mode, and an identification mode. In such applications, the first and second signals of the multi-color slab waveguide QWIP 300 can be added to increase the total signal leading to greater detection mode sensitivity. The resultant combined signal is thus a spectrally broadband signal. Once an object is detected, the first and second signals are processed separately to provide wavelength discrimination for object identification.

When two separate signals are not required, but a spectrally broadband signal is desired, an alternative to adding two signals together is used. By using a single IR absorbing layer, much like the first embodiment, but with spectrally broad absorption, a broadband signal can be generated. The resultant broadband slab waveguide QWIP is designed to support two or more TM modes at two or more corresponding wavelengths, much like the second embodiment. Such a design has the advantage that a contact is not located in the middle of the broadband slab waveguide QWIP where the even order TM modes have their greatest electric field strength.

The multi-color slab waveguide QWIP 300 can be used to estimate the temperature of an object. This temperature estimation is based upon the two signals, corresponding to the two bands of IR radiation, produced by the multi-color slab waveguide QWIP 300. All objects at temperatures greater than absolute zero emit IR radiation. This emitted IR radiation follows Planck's law, which gives the magnitude of the radiation as a function of wavelength and temperature of the object. The magnitude and shape of a curve generated by Planck's law thus provides one method of determining an object's temperature. Thus, by using the magnitudes of signals taken at two, or more, different IR wavelengths, and Planck's law, the temperature of the object can be determined. Planck's law is followed perfectly by a blackbody, one with an emissivity of 1.0 at all wavelengths, and therefore, the temperature of a blackbody object can be very accurately determined. Most objects have emissivities that are less than one or have emissivities that vary as a function of wavelength, leading to a modification of Planck's law. For non-blackbodies, the temperature of the object can still be determined. Objects that have a constant emissivity of less than one, "gray-bodies," emit IR radiation as a function of wavelength that is identical in shape, but reduced in magnitude in comparison to a blackbody. For these gray-bodies, simple scaling of the magnitude of Planck's law can result in very accurate temperature determination. Temperature determination for an object whose emissivity is a function of wavelength is typically less accurate than for a black or gray-body object, especially if only two different wavelength signals are used. When the emissivity of an object varies as a function of wavelength, temperature determination generally assumes the object is a gray-body as emissivity is usually not a strong function of wavelength.

Figure 5:
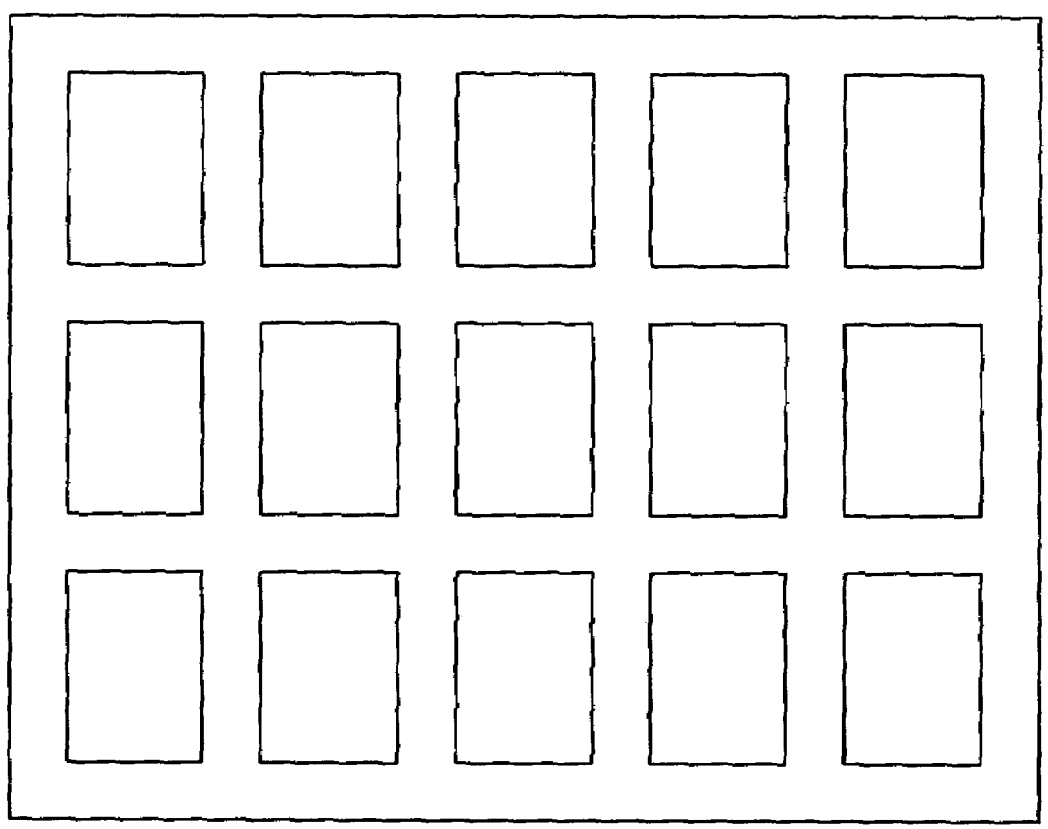
FIG. 5 illustrates a plan view of a photodetector according to a variation of the second embodiment.

As described above, TM modes can be generated that propagate in orthogonal directions. A slab waveguide QWIP using orthogonal TM modes can be designed that is sensitive to the polarization of the incident IR radiation. This polarization sensitivity is readily compatible with the multi-color slab waveguide QWIP 300. A polarization-sensitive, multi-color slab waveguide QWIP employs a two-dimensional grating 500, having different periods in the two orthogonal directions as seen in FIG. 5. The grating period in a first direction launches IR radiation in a first band of IR radiation that is absorbed in a first IR absorbing layer. The grating period in a second direction, orthogonal to the first direction, launches IR radiation in a second band of IR radiation that is absorbed in a second IR absorbing layer. While providing wavelength and polarization sensitivity, this polarization-sensitive, multi-color slab waveguide QWIP does not provide polarization sensitivity in a single IR wavelength band.

Figure 6:
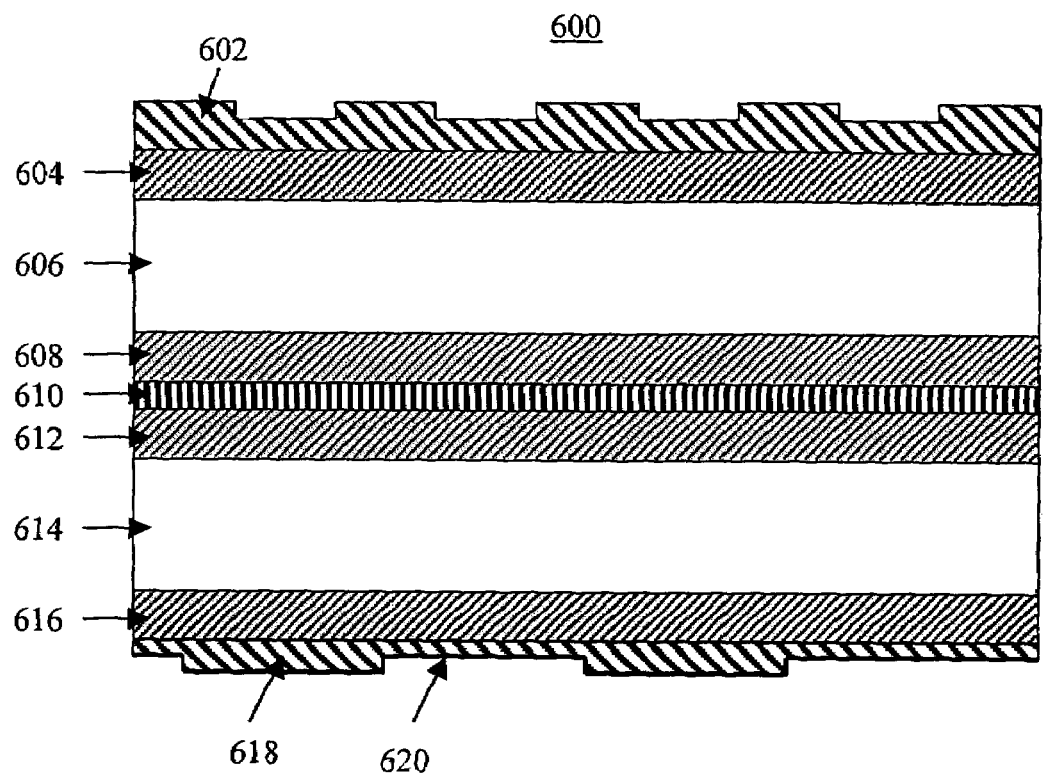
FIG. 6 illustrates a cross sectional view of a photodetector according to a third embodiment.

A third embodiment, for multi-color sensitivity, employs a stack of independent slab waveguide QWIPs. A dual slab waveguide QWIP 600, illustrated in FIG. 6, includes a transmissive grating on a first cladding layer 602, a first contact 604, a first IR absorbing layer 606, a second contact 608, a mid-layer 610, a third contact 612, a second IR absorbing layer 614, a fourth contact 616, a second cladding layer 618 and a reflective layer 620. Each of these elements, except for the mid-layer 610, has generally been described above. For proper operation of the dual slab waveguide QWIP, the mid-layer 610 must have an index of refraction that is less than the indices of refraction of the first through fourth contacts 604, 608, 612, 616, and the first and second IR absorbing layers 606, 614. The result is that the first and second IR absorbing layers 606, 614 are located in independent slab waveguides as the two bands of IR radiation undergo TIR at the mid-layer 610.

In a preferred embodiment of the dual slab waveguide QWIP 600, the shorter wavelength band of IR radiation be absorbed by the first IR absorbing layer 606. Also, the mid-layer 610 is configured to provide some wavelength filtering by passing the longer wavelength band of IR radiation and blocking the shorter wavelength band of IR radiation. The transmissive grating on the first cladding layer 602 has a period designed for the propagation wavelength $\lambda_P$ of the shorter wavelength band of IR radiation, while only minimally diffracting the longer wavelength band of IR radiation. The reflective grating formed by the reflective layer 620 on the second cladding layer 618 is designed for the propagation wavelength $\lambda_P$ of the longer wavelength band of IR radiation. With this configuration, the transmissive grating on the first cladding layer 602 launches the shorter wavelength band of IR radiation for absorption in the first IR absorbing layer 606. Independently, the reflective grating launches the longer wavelength band of IR radiation for absorption in the second IR absorbing layer 614. The dual slab waveguide QWIP 600 therefore allows completely independent optimization of each waveguide without requiring that the propagation wavelengths for each band of IR radiation be equal.

In another embodiment of the dual slab waveguide QWIP 600, each of the two slab waveguides is a two-color slab waveguide QWIP. This embodiment is therefore essentially a pair of stacked two-color slab waveguide QWIPs according to the second embodiment with an intervening mid-layer. The first of the pair of stacked two-color slab waveguide QWIPs employs a transmissive grating, while the second employs a reflective grating. Because each of the pair of stacked two-color slab waveguide QWIPs responds to two different bands of IR radiation, the final device is sensitive to a total of four different bands of IR radiation.

The various embodiments described thus far employ a symmetric slab waveguide. That is, a plane of symmetry occurs within the slab waveguide QWIP that is equivalent to the center plane of the center dielectric slab 102 in the ideal dielectric slab waveguide structure 100. However, an asymmetric slab waveguide can be used. Such asymmetric waveguides are frequently used when guiding EM radiation, such as radio frequency radiation in a strip waveguide on a large, planar substrate. An asymmetric slab waveguide QWIP can be created, for example, by using different materials for the antireflection layer and the cladding layer.

Figure 7:
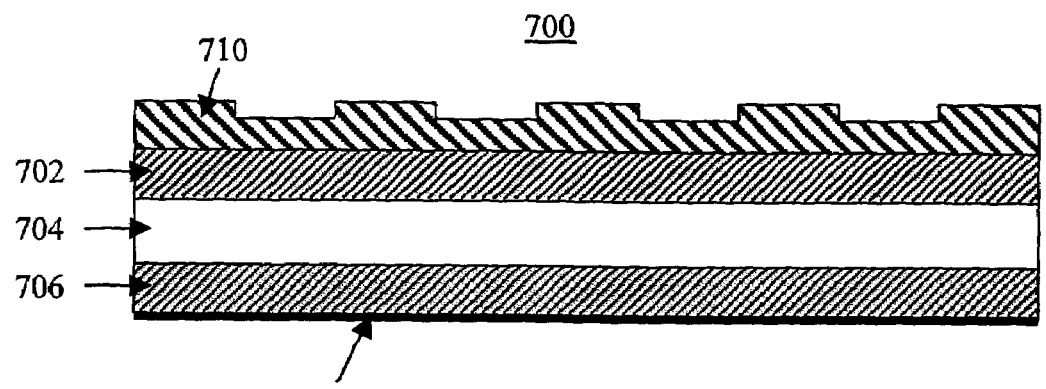
FIG. 7 illustrates a cross sectional view of a photodetector according to a fourth embodiment.

A fourth embodiment, using an asymmetric waveguide, is created by locating a groundplane at the center plane of a symmetric waveguide. A groundplane slab waveguide QWIP 700 employing such a groundplane is shown in FIG. 7. The groundplane slab waveguide QWIP 700 includes first and second contact layers 702, 706 on either side of an IR absorbing layer 704. A transmissive grating 710 is disposed on the front surface of the groundplane slab waveguide QWIP 700 and serves to launch the incident IR radiation. This transmissive grating 710 also functions like the first dielectric half space 104 of FIG. 1A, as the transmissive grating 710 is also a cladding layer for TIR of the IR radiation. The primary effect of including the groundplane 708, is that the thickness of the groundplane slab waveguide QWIP 700 is half of that for a similar slab waveguide QWIP 220. In other words, the groundplane effectively doubles the thickness of the groundplane slab waveguide QWIP 700, generating a given even TM mode in half the thickness of a similar slab waveguide QWIP 220. By locating the groundplane 708 at the center plane of a symmetric waveguide, only even TM modes are supported as the maxima of an odd TM mode cannot be supported by the groundplane 708. A multi-color groundplane slab waveguide QWIP is also envisioned.

The various embodiments disclosed above have included optional antireflection layers. As an alternative, the antireflection function of these optional antireflection layers can be undertaken by using Fabry-Perot resonances. A Fabry-Perot resonance is created when a thickness of a structure is equal to an odd multiple of one-quarter of the bulk wavelength $\lambda_B$ of the radiation. This Fabry-Perot thickness creates a vertical standing wave for the incident IR radiation, thereby reducing reflection of the incident IR radiation. A slab waveguide QWIP employing a Fabry-Perot resonance to reduce reflection of the incident IR radiation therefore has a total thickness that supports both a Fabry-Perot resonance and a TM mode.

The various described embodiments were based upon using TM waveguide modes. If TE waveguide modes are used, IR absorbing material that does not place limits on the direction of the electric field vector can be used. Such isotropic IR radiation absorbing materials include direct band gap materials such as HgCdTe and InSb as is well known in the art. Therefore, while most of this description has focused on the use of MQW material, the invention is not so limited. It should further be noted that due to the high fields created in the TM or TE waveguide modes, IR radiation absorbing materials with high absorption coefficients can be made thinner and/or smaller. By making a slab waveguide photodetector from such materials, the quantum efficiency can remain high, while the dark current is significantly reduced.

While the drawings of the various embodiments have illustrated portions of single detectors, this is not required. A detector array comprising a plurality of individual detectors is also envisioned. Such a detector array can be used to image a scene and determine the emitted wavelengths, polarizations, and/or temperatures of objects within the imaged scene. Such a detector array may be a one- or two-dimensional array of individual detectors.

Although the present invention has been fully described by way of examples with reference to the accompanying drawings, it is to be noted that various changes and modifications will be apparent to those skilled in the art. Therefore, such changes and modifications should be construed as being within the scope of the invention.

What is claimed is:

1. A slab waveguide photodetector for detecting infrared radiation, the slab waveguide photodetector comprising:
   a first contact;
   an infrared absorbing layer for absorbing the infrared radiation, the infrared absorbing layer being in contact with the first contact, the first contact for making electrical contact to the infrared absorbing layer;
   a second contact for making electrical contact to the infrared absorbing layer, the second contact being in contact with the infrared absorbing layer, a signal being generated between the first and second contacts when the infrared absorbing layer absorbs the infrared radiation;
   a cladding layer for guiding the infrared radiation, the cladding layer exhibiting an index of refraction that is lower than an index of refraction of the second contact, the cladding layer being disposed on a surface of the second contact opposite the infrared absorbing layer; and
   a grating having a period suitable for launching the infrared radiation in a waveguide mode into the infrared absorbing layer, the grating being disposed on a surface of the cladding layer opposite the second contact, wherein a total thickness of the first and second contacts and the infrared absorbing layer is adapted to support the waveguide mode for the infrared radiation to be absorbed by the infrared absorbing layer.

2. A slab waveguide photodetector in accordance with claim 1, further comprising an antireflection layer for reducing reflection of the infrared radiation, the antireflection layer being disposed on a surface of the first contact opposite the infrared absorbing layer.

3. A slab waveguide photodetector in accordance with claim 1, wherein the infrared absorbing layer includes multiple quantum well semiconductor material.

4. A slab waveguide photodetector in accordance with claim 3, wherein the multiple quantum well semiconductor material is GaAs/AlGaAs or InGaAs/AlGaAs multiple quantum well semiconductor material.

5. A slab waveguide photodetector in accordance with claim 4, wherein the first and second contacts include n-type GaAs semiconductor material.

6. A slab waveguide photodetector in accordance with claim 1, wherein a period of the grating is approximately equal to n times a propagation wavelength of the infrared radiation in the waveguide mode, where n is an integer greater than zero.

7. A slab waveguide photodetector in accordance with claim 1, wherein a depth of the grating is approximately equal to one-fourth of a bulk wavelength of the infrared radiation in the cladding layer.

8. A slab waveguide photodetector in accordance with claim 1, wherein the grating is a one-dimensional grating.

9. A slab waveguide photodetector in accordance with claim 1, wherein the grating is a two-dimensional grating.

10. A slab waveguide photodetector in accordance with claim 1, wherein the grating is a transmissive grating.

11. A slab waveguide photodetector in accordance with claim 1, wherein the grating is a reflective grating.

12. A slab waveguide photodetector in accordance with claim 1, further comprising a reflective layer for reflecting the infrared radiation, the reflective layer being disposed on the grating.

13. A slab waveguide photodetector for detecting infrared radiation, the slab waveguide photodetector comprising:
    a first contact;
    an infrared absorbing layer for absorbing the infrared radiation, the infrared absorbing layer being in contact with the first contact, the first contact for making electrical contact to the infrared absorbing layer;
    a second contact for making electrical contact to the infrared absorbing layer, the second contact being in contact with the infrared absorbing layer, a signal being generated between the first and second contacts when the infrared absorbing layer absorbs the infrared radiation;
    a cladding layer for guiding the infrared radiation, the cladding layer exhibiting an index of refraction that is lower than an index of refraction of the second contact, the cladding layer being disposed on a surface of the second contact opposite the infrared absorbing layer; and
    a grating for launching the infrared radiation into the infrared absorbing layer, the grating being disposed on a surface of the cladding layer opposite the second contact, wherein a total thickness of the first and second contacts and the infrared absorbing layer is adapted to support a waveguide mode for the infrared radiation to be absorbed by the infrared absorbing layer, wherein a period of the grating is approximately equal to n times a propagation wavelength of the infrared radiation in the waveguide mode within the slab waveguide photodetector, where n is an integer greater than zero, and wherein a depth of the grating is approximately equal to one-fourth of a bulk wavelength of the infrared radiation in the slab waveguide photodetector.

14. A slab waveguide photodetector in accordance with claim 13, further comprising an antireflection layer for reducing reflection of the infrared radiation, the antireflection layer being disposed on a surface of the first contact opposite the infrared absorbing layer.

15. A slab waveguide photodetector in accordance with claim 13, wherein the infrared absorbing layer includes multiple quantum well semiconductor material.

16. A slab waveguide photodetector in accordance with claim 13, wherein the grating is a transmissive grating.

17. A slab waveguide photodetector in accordance with claim 13, wherein the grating is a reflective grating.

18. A slab waveguide photodetector for detecting infrared radiation, the slab waveguide photodetector comprising:
   a first contact;
   a cladding layer exhibiting an index of refraction less than an index of refraction of the contact layer;
   an infrared absorbing layer for absorbing the infrared radiation; and
   a grating for launching the infrared radiation into the infrared absorbing layer, the grating being in contact with the infrared absorbing layer through the contact and the cladding layer, wherein a total thickness of the slab waveguide photodetector is adapted to support a waveguide mode for the infrared radiation to be absorbed by the infrared absorbing layer, and wherein a period of the grating is substantially equal to n times a propagation wavelength of the infrared radiation in the waveguide mode within the slab waveguide photodetector, where n is an integer greater than zero.

19. A slab waveguide photodetector in accordance with claim 18, further comprising an antireflection layer for reducing reflection of the infrared radiation and a second contact disposed between the antireflection layer and the infrared absorbing layer, the antireflection layer being disposed on a surface of the first contact opposite the infrared absorbing layer.

20. A slab waveguide photodetector in accordance with claim 18, wherein the infrared absorbing layer includes multiple quantum well semiconductor material.

21. A slab waveguide photodetector in accordance with claim 18, wherein the grating is a transmissive grating.

22. A slab waveguide photodetector in accordance with claim 18, wherein the grating is a reflective grating.

23. A groundplane slab waveguide photodetector for detecting infrared radiation, the slab waveguide photodetector comprising:
   a groundplane for reflecting the infrared radiation;
   a first contact being in contact with the groundplane;
   an infrared absorbing layer for absorbing the infrared radiation, the infrared absorbing layer being in contact with the first contact, the first contact for making electrical contact to the infrared absorbing layer;
   a second contact for making electrical contact to the infrared absorbing layer, the second contact being in contact with the infrared absorbing layer, a signal being generated between the first and second contacts when the infrared absorbing layer absorbs the infrared radiation;
   a cladding layer for guiding the infrared radiation, the cladding layer exhibiting an index of refraction that is lower than an index of refraction of the second contact, the cladding layer being disposed on a surface of the second contact opposite the infrared absorbing layer; and
   a transmissive grating having a period suitable for launching the infrared radiation in a waveguide mode into the infrared absorbing layer, the grating being disposed on a surface of the cladding layer opposite the second contact;
   wherein a total thickness of the first and second contacts and the infrared absorbing layer is adapted to support the waveguide mode for the infrared radiation to be absorbed by the infrared absorbing layer.

24. A groundplane slab waveguide photodetector in accordance with claim 23, wherein the infrared absorbing layer includes multiple quantum well semiconductor material.

25. A slab waveguide photodetector array for imaging infrared radiation, the slab waveguide photodetector array comprising:
   a plurality of slab waveguide photodetectors, each slab waveguide photodetector including:
   a first contact;
   an infrared absorbing layer for absorbing the infrared radiation, the infrared absorbing layer being in contact with the first contact, the first contact for making electrical contact to the infrared absorbing layer;
   a second contact for making electrical contact to the infrared absorbing layer, the second contact being in contact with the infrared absorbing layer, a signal being generated between the first and second contacts when the infrared absorbing layer absorbs the infrared radiation;
   a cladding layer for guiding the infrared radiation, the cladding layer exhibiting an index of refraction that is lower than an index of refraction of the second contact, the cladding layer being disposed on a surface of the second contact opposite the infrared absorbing layer; and
   a grating having a period suitable for launching the infrared radiation in a waveguide mode into the infrared absorbing layer, the grating being disposed on a surface of the cladding layer opposite the second contact;
   wherein a total thickness of the first and second contacts and the infrared absorbing layer is adapted to support the waveguide mode for the infrared radiation to be absorbed by the infrared absorbing layer.

26. A slab waveguide photodetector array in accordance with claim 25, wherein each slab waveguide photodetector further includes an antireflection layer for reducing reflection of the infrared radiation, the antireflection layer being disposed on a surface of the first contact opposite the infrared absorbing layer.

27. A slab waveguide photodetector array in accordance with claim 25, wherein the infrared absorbing layer in each slab waveguide photodetector includes multiple quantum well semiconductor material.

28. A slab waveguide photodetector in accordance with claim 25, wherein the grating in each slab waveguide photodetector is a transmissive grating.

29. A slab waveguide photodetector in accordance with claim 25, wherein the grating in each slab waveguide photodetector is a reflective grating.

30. A method for detecting infrared radiation, the method comprising:
   providing a slab waveguide photodetector, the slab waveguide photodetector including an infrared absorbing layer for absorbing infrared radiation, a contact, a cladding layer exhibiting an index of refraction less than an index of refraction of the contact layer, and a grating, the grating being in contact with the infrared absorbing layer through the contact and the cladding layer, a total thickness of the slab waveguide photodetector being adapted to support a waveguide mode for the infrared radiation to be absorbed by the infrared absorbing layer;

orienting the slab waveguide photodetector such that infrared radiation is incident upon the slab waveguide photodetector, a period of the grating suitable for launching the incident infrared radiation in the waveguide mode into the infrared absorbing layer; and detecting the thus launched infrared radiation when absorbed by the infrared absorbing layer.

31. A multi-color slab waveguide photodetector for detecting multiple bands of infrared radiation, the multi-color slab waveguide photodetector comprising:
a first contact;
a first infrared absorbing layer for absorbing a first band of infrared radiation, the first infrared absorbing layer being in contact with the first contact, the first contact for making electrical contact to the first infrared absorbing layer;
a second contact for making electrical contact to the first infrared absorbing layer, the second contact being in contact with the first infrared absorbing layer, a first signal being generated between the first and second contacts when the first infrared absorbing layer absorbs infrared radiation in the first band of infrared radiation;
a second infrared absorbing layer for absorbing a second band of infrared radiation, the second infrared absorbing layer being in contact with the second contact, the second contact for making electrical contact to the second infrared absorbing layer;
a third contact for making electrical contact to the second infrared absorbing layer, the third contact being in contact with the second infrared absorbing layer, a second signal being generated between the second and third contacts when the second infrared absorbing layer absorbs infrared radiation in the second band of infrared radiation;
a cladding layer for guiding the infrared radiation, the cladding layer exhibiting an index of refraction that is lower than an index of refraction of the third contact, the cladding layer being disposed on a surface of the third contact opposite the second infrared absorbing layer; and
a grating having a period suitable for launching the first and second bands of infrared radiation in corresponding first and second waveguide modes into the first and second infrared absorbing layers, the grating being disposed on a surface of the cladding layer opposite the third contact, wherein a total thickness of the first, second, and third contacts and the first and second infrared absorbing layers is adapted to support the first and second waveguide modes for corresponding first and second bands of infrared radiation to be absorbed by the first and second infrared absorbing layers.

32. A multi-color slab waveguide photodetector in accordance with claim 31, further comprising an antireflection layer for reducing reflection of the infrared radiation, the antireflection layer being disposed on a surface of the first contact opposite the first infrared absorbing layer.

33. A multi-color slab waveguide photodetector in accordance with claim 31, wherein the first and second infrared absorbing layers include multiple quantum well semiconductor material.

34. A multi-color slab waveguide photodetector in accordance with claim 33, wherein the multiple quantum well semiconductor material is GaAs/AlGaAs or InGaAs/AlGaAs multiple quantum well semiconductor material.

35. A multi-color slab waveguide photodetector in accordance with claim 34, wherein the first, second, and third contacts include n-type GaAs semiconductor material.

36. A multi-color slab waveguide photodetector in accordance with claim 31, wherein a period of the grating is approximately equal to n times a propagation wavelength of the first and second bands of infrared radiation in corresponding first and second waveguide modes, where n is an integer greater than zero.

37. A multi-color slab waveguide photodetector in accordance with claim 31, wherein a depth of the grating is approximately equal to an average of one-fourth of a bulk wavelength of the first and second bands of infrared radiation in the cladding layer.

38. A multi-color slab waveguide photodetector in accordance with claim 31, wherein the grating is a one-dimensional grating.

39. A multi-color slab waveguide photodetector in accordance with claim 31, wherein the grating is a two-dimensional grating.

40. A multi-color slab waveguide photodetector in accordance with claim 31, wherein the grating is a transmissive grating.

41. A multi-color slab waveguide photodetector in accordance with claim 31, wherein the grating is a reflective grating.

42. A multi-color slab waveguide photodetector in accordance with claim 31, further comprising a reflective layer for reflecting the first and second bands of infrared radiation, the reflective layer being disposed on the grating.

43. A multi-color slab waveguide photodetector for detecting multiple bands of infrared radiation, the multi-color slab waveguide photodetector comprising:
a first infrared absorbing layer for absorbing a first band of infrared radiation, a first signal being generated when the first infrared absorbing layer absorbs infrared radiation in the first band of infrared radiation;
a contact;
a cladding layer exhibiting an index of refraction less than an index of refraction of the contact;
a second infrared absorbing layer for absorbing a second band of infrared radiation, the second infrared absorbing layer being in contact through at least one layer with the first infrared absorbing layer, a second signal being generated when the second infrared absorbing layer absorbs infrared radiation in the second band of infrared radiation; and
a grating for launching the first and second bands of infrared radiation into the first and second infrared absorbing layers, the grating being in contact with the second infrared absorbing layer through the contact and the cladding layer, wherein a total thickness of the slab waveguide photodetector is adapted to support first and second waveguide modes corresponding to first and second bands of infrared radiation to be absorbed by the first and second infrared absorbing layers, and wherein a period of the grating is substantially equal to n times a propagation wavelength of the first and second bands of infrared radiation in the first and second waveguide modes, where n is an integer greater than zero.

44. A multi-color slab waveguide photodetector in accordance with claim 43, further comprising an antireflection layer for reducing reflection of the first and second bands of infrared radiation, the antireflection layer being disposed on a surface of the first contact opposite the first infrared absorbing layer.

45. A multi-color slab waveguide photodetector in accordance with claim 43, wherein the first and second infrared absorbing layers include multiple quantum well semiconductor material.

46. A multi-color slab waveguide photodetector in accordance with claim 43, wherein the grating is a transmissive grating.

47. A multi-color slab waveguide photodetector in accordance with claim 43, wherein the grating is a reflective grating.

48. A dual slab waveguide photodetector for detecting first and second bands of infrared radiation, the dual slab waveguide photodetector comprising:
- a transmissive grating for launching the first band of infrared radiation;
- a first cladding layer for guiding the first band of infrared radiation;
- the transmissive grating being disposed on a first surface of the cladding layer;
- a first contact, the first contact being disposed on a second surface of the first cladding layer opposite the transmissive grating;
- a first infrared absorbing layer for absorbing the thus launched first band of infrared radiation, the first infrared absorbing layer being in contact with the first contact, the first contact for making electrical contact to the first infrared absorbing layer;
- a second contact for making electrical contact to the first infrared absorbing layer, the second contact being in contact with the first infrared absorbing layer, a first signal being generated between the first and second contacts when the first infrared absorbing layer absorbs infrared radiation in the first band of infrared radiation;
- a mid-layer for guiding the first and second bands of infrared radiation, the mid-layer being in contact with the second contact;
- a third contact, the third contact being in contact with the mid-layer;
- a second infrared absorbing layer for absorbing the second band of infrared radiation, the second infrared absorbing layer being in contact with the third contact, the third contact for making electrical contact to the second infrared absorbing layer;
- a fourth contact for making electrical contact to the second infrared absorbing layer, the fourth contact being in contact with the second infrared absorbing layer, a second signal being generated between the third and fourth contacts when the second infrared absorbing layer absorbs infrared radiation in the second band of infrared radiation;
- a second cladding layer for guiding the infrared radiation, the second cladding layer being disposed on a surface of the fourth contact opposite the second infrared absorbing layer; and
- a reflective grating for launching the second band of infrared radiation into the second infrared absorbing layer, the reflective grating being disposed on a surface of the second cladding layer opposite the fourth contact, wherein a total thickness of the first and second contacts and the first infrared absorbing layer is adapted to support a first waveguide mode for the first band of infrared radiation to be absorbed by the first infrared absorbing layer, and wherein a total thickness of the third and fourth contacts and the second infrared absorbing layer is adapted to support a second waveguide mode for the second band of infrared radiation to be absorbed by the second infrared absorbing layer.

49. A dual slab waveguide photodetector in accordance with claim 48, wherein the first and second infrared absorbing layers include multiple quantum well semiconductor material.

50. A dual slab waveguide photodetector, in accordance with claim 48, wherein the mid-layer exhibits an index of refraction that is less than an index of refraction exhibited by either the first contact or the second contact.

51. A multi-color slab waveguide photodetector array for imaging multiple bands of infrared radiation, the multi-color slab waveguide photodetector array comprising:
- a plurality of multi-color slab waveguide photodetectors, each multi-color slab waveguide photodetector including:
- a first contact;
- a first infrared absorbing layer for absorbing a first band of infrared radiation, the first infrared absorbing layer being in contact with the first contact, the first contact for making electrical contact to the first infrared absorbing layer;
- a second contact for making electrical contact to the first infrared absorbing layer, the second contact being in contact with the first infrared absorbing layer, a first signal being generated between the first and second contacts when the first infrared absorbing layer absorbs infrared radiation in the first band of infrared radiation;
- a second infrared absorbing layer for absorbing a second band of infrared radiation, the second infrared absorbing layer being in contact with the second contact, the second contact for making electrical contact to the second infrared absorbing layer;
- a third contact for making electrical contact to the second infrared absorbing layer, the third contact being in contact with the second infrared absorbing layer, a second signal being generated between the second and third contacts when the second infrared absorbing layer absorbs infrared radiation in the second band of infrared radiation,
- a cladding layer for guiding the first and second bands of infrared radiation, the cladding layer exhibiting an index of refraction that is lower than an index of refraction of the third contact, the cladding layer being disposed on a surface of the third contact opposite the second infrared absorbing layer; and
- a grating for launching the first and second bands of infrared radiation into the first and second infrared absorbing layers, the grating being disposed on a surface of the cladding layer opposite the third contact, wherein a total thickness of the first, second, and third contacts and the first and second infrared absorbing layers is selected to support first and second waveguide modes for corresponding first and second bands of infrared radiation to be absorbed by the first and second infrared absorbing layers.

52. A multi-color slab waveguide photodetector array in accordance with claim 51, wherein each multi-color slab waveguide photodetector further comprises an antireflection layer for reducing reflection of the first and second bands of infrared radiation, the antireflection layer being disposed on a surface of the first contact opposite the first infrared absorbing layer.

53. A multi-color slab waveguide photodetector array in accordance with claim 51, wherein the first and second infrared absorbing layers in each multi-color slab waveguide photodetector include multiple quantum well semiconductor material.

54. A multi-color slab waveguide photodetector array in accordance with claim 51, wherein the grating in each multi-color slab waveguide photodetector is a transmissive grating.

55. A multi-color slab waveguide photodetector array in accordance with claim 51, wherein the grating in each multi-color slab waveguide photodetector is a reflective grating.

56. A method for detecting multiple bands of infrared radiation, the method comprising:
   providing a multi-color slab waveguide photodetector, the multi-color slab waveguide including first and second infrared absorbing layers for absorbing first and second bands of infrared radiation, a contact, and a cladding layer exhibiting an index of refraction less than an index of refraction of the contact, the second infrared absorbing layer being in contact through at least one layer with the first infrared absorbing layer, and a grating, the grating being in contact with the second infrared absorbing layer through the contact and the cladding layer, a total thickness of the multi-color slab waveguide photodetector being adapted to support first and second waveguide modes for corresponding first and second bands of infrared radiation to be absorbed by the first and second infrared absorbing layers;
   orienting the multi-color slab waveguide photodetector such that first and second bands of infrared radiation are incident upon the multi-color slab waveguide photodetector, a period of the grating suitable for launching the incident first and second bands of infrared radiation in the corresponding first and second waveguide modes into the first and second infrared absorbing layers; and
   detecting the thus launched first and second bands of infrared radiation when absorbed by the first and second infrared absorbing layers.

57. A method for determining a temperature of an object using infrared radiation, the method comprising:
   providing a multi-color slab waveguide photodetector, the multi-color slab waveguide including first and second infrared absorbing layers for absorbing first and second bands of infrared radiation, a contact, and a cladding layer exhibiting an index of refraction less than an index of refraction of the contact layer, the second infrared absorbing layer being in contact through at least one layer with the first infrared absorbing layer, and a grating, the grating being in contact with the second infrared absorbing layer through the contact and the cladding layer, a total thickness of the multi-color slab waveguide photodetector being adapted to support first and second waveguide modes for corresponding first and second bands of infrared radiation to be absorbed by the first and second infrared absorbing layers;
   orienting the multi-color slab waveguide photodetector such that first and second bands of infrared radiation are incident upon the multi-color slab waveguide photodetector, a period of the grating suitable for launching the incident first and second bands of infrared radiation in the corresponding first and second waveguide modes into the first and second infrared absorbing layers;
   generating first and second signals when corresponding first and second bands of infrared radiation are absorbed by the first and second infrared absorbing layers; and
   determining the temperature of the object by comparing the first and second signals to Planck's law as a function of temperature at the first and second wavelength bands.

58. A method for determining a polarization of infrared radiation emitted by an object, the method comprising:
   providing a multi-color slab waveguide photodetector, the multi-color slab waveguide including first and second infrared absorbing layers for absorbing first and second bands of infrared radiation, a contact, and a cladding layer exhibiting an index of refraction less than an index of refraction of the contact layer, the second infrared absorbing layer being in contact through at least one layer with the first infrared absorbing layer, and a grating, the grating being in contact with the second infrared absorbing layer through the contact and the cladding layer, a total thickness of the multi-color slab waveguide photodetector being adapted to support first and second waveguide modes for corresponding first and second bands of infrared radiation to be absorbed by the first and second infrared absorbing layers;
   orienting the multi-color slab waveguide photodetector such that first and second bands of infrared radiation are incident upon the multi-color slab waveguide photodetector, a period of the grating in a first direction suitable for launching the incident first band of infrared radiation in the first waveguide mode into the first infrared absorbing layer, a period of the grating in a second direction suitable for launching the incident second band of infrared radiation in the second waveguide mode into the second infrared absorbing layer, the second direction being orthogonal to the first direction, the second period being different than the first period; and
   detecting the thus launched first and second bands of infrared radiation when absorbed by the first and second infrared absorbing layers generating first and second signals when corresponding first and second bands of infrared radiation are absorbed by the first and second infrared absorbing layers; and
   determining the polarization of the infrared radiation emitted by the object by comparing the magnitude of the first and second signals.

* * * * *